United States Patent
Wang et al.

(10) Patent No.: US 6,595,275 B1
(45) Date of Patent: Jul. 22, 2003

(54) HEAT SINK ASSEMBLY

(75) Inventors: Jack Wang, 2, Ta-Chih Rd., Taoyuan City, Taoyuan Hsien (TW); Cheng-Hua Cheng, Taoyuan (TW); Michael Lin, Taoyuan (TW); Charles Ma, Taoyuan (TW)

(73) Assignees: Waffer Technology Corp., Taoyuan Hsien (TW); Jack Wang, Taoyuan Hsien (TW)

(*) Notice: Subject to any disclaimer, the term of this patent is extended or adjusted under 35 U.S.C. 154(b) by 0 days.

(21) Appl. No.: 10/187,290

(22) Filed: Jul. 2, 2002

(51) Int. Cl.[7] .................................................. F28F 7/00
(52) U.S. Cl. ....................... 165/185; 165/80.3; 361/697; 361/704; 257/722; 174/16.3
(58) Field of Search ......................... 165/80.3, 185; 361/697, 704, 709, 710; 174/16.3; 257/706, 722

(56) References Cited

U.S. PATENT DOCUMENTS

| | | | | |
|---|---|---|---|---|
| 2,419,233 A | * | 4/1947 | Spender | 165/185 |
| 2,434,676 A | * | 1/1948 | Spender | 165/185 |
| 2,694,554 A | * | 11/1954 | Lemeshka | 165/185 |
| 6,373,699 B1 | * | 4/2002 | Chen | 361/697 |
| 6,386,275 B1 | * | 5/2002 | Kuo et al. | 165/80.3 |
| 6,396,697 B1 | * | 5/2002 | Chen | 361/704 |
| 6,401,810 B1 | * | 6/2002 | Kuo et al. | 165/185 |
| 6,419,007 B1 | * | 7/2002 | Ogawara et al. | 165/80.3 |

* cited by examiner

Primary Examiner—Henry Bennett
Assistant Examiner—Terrell McKinnon
(74) Attorney, Agent, or Firm—Troxell Law Office PLLC (57) ABSTRACT

A heat dissipation assembly includes a base with a ridge and multiple fins mounted on top of the base. Each of the fins has a plate with a cutout defined in a mediate portion of a bottom edge to correspond to the ridge of the base, two first bends respectively extending from opposite sides of the cutout in a same direction from the bottom edge and a second bend formed on a top edge of the cutout. The fins are able to be securely mounted on top of the base via the two first bends.

13 Claims, 9 Drawing Sheets

HEAT SINK ASSEMBLY

BACKGROUND OF THE INVENTION

1. Field of the Invention

The present invention relates to a heat sink assembly, and more particularly to a heat sink assembly with a base and multiple fins securely mounted on top of the base. The base has a ridge and each fin has a cutout defined in a bottom of the fin to correspond to the ridge and first bends and a second bend respectively formed on the bottom of the fin and a top face defining the cutout so that the first bends are able to be securely engaged with a top face of the base and the second bend is able to be securely engaged with a top face of the ridge. With such an arrangement, the heat sink assembly is able to adapt to different situations to effectively dissipate heat.

2. Description of Related Art

As modern technology dramatically develops, electrical components easily generate heat due to high speed calculation. Because the electrical components can only function normally under a specific temperature range, maintaining the temperature within the predetermined temperature range is crucial in every electrical appliance. In order to accomplish the purpose, inventions are introduced to the market. However, no matter what kind of inventions are developed, the inventions are structurally fixed and have no flexibility to adapt to different mounting situations. That is, a heat sink can only deal with one mounting situation and needs a lot of embodiments to adapt to different mounting situations. Especially, after the heat dissipating fan is mounted to increase the heat dissipation effect, often the heat dissipation effect is not as good as expected. That is, the air flow direction is not able to be adapted to the fin orientations. To make the change in order to change the fin direction to adapt to the air flow direction of the heat dissipation fan, the cost is high.

To overcome the shortcomings, the present invention tends to provide an improved heat dissipation assembly to mitigate and obviate the aforementioned problems.

SUMMARY OF THE INVENTION

The primary objective of the present invention is to provide an improved heat dissipation assembly adaptable to deal with different mounting situations.

Another objective of the present invention is to provide an improved heat dissipation assembly having a base with a ridge and multiple fins securely mounted on top of the base. Each fin has a cutout defined in a mediate portion and two first bends formed on a bottom of the fin and a second bend formed on a top face defining the cutout and sandwiched by the two first bends. The ridge is inclined relative to sides of the base so that the cutouts of the fins are so configured to mate the ridges so that the fins are able to be securely mounted on top of the base.

Still another objective of the present invention is that the ridge of the base is arcuate relative to the sides of the base and the cutouts of the fins are so configured to mate the ridge so that the fins are able to be securely mounted on top of the base.

Another objective of the present invention is that the ridge is annularly formed on top of the base and the cutouts are so configured to mate the ridge so that the fins are able to be securely mounted on top of the base.

Other objects, advantages and novel features of the invention will become more apparent from the following detailed description when taken in conjunction with the accompanying drawings.

DETAILED DESCRIPTION OF THE PREFERRED EMBODIMENT

Figure 1:
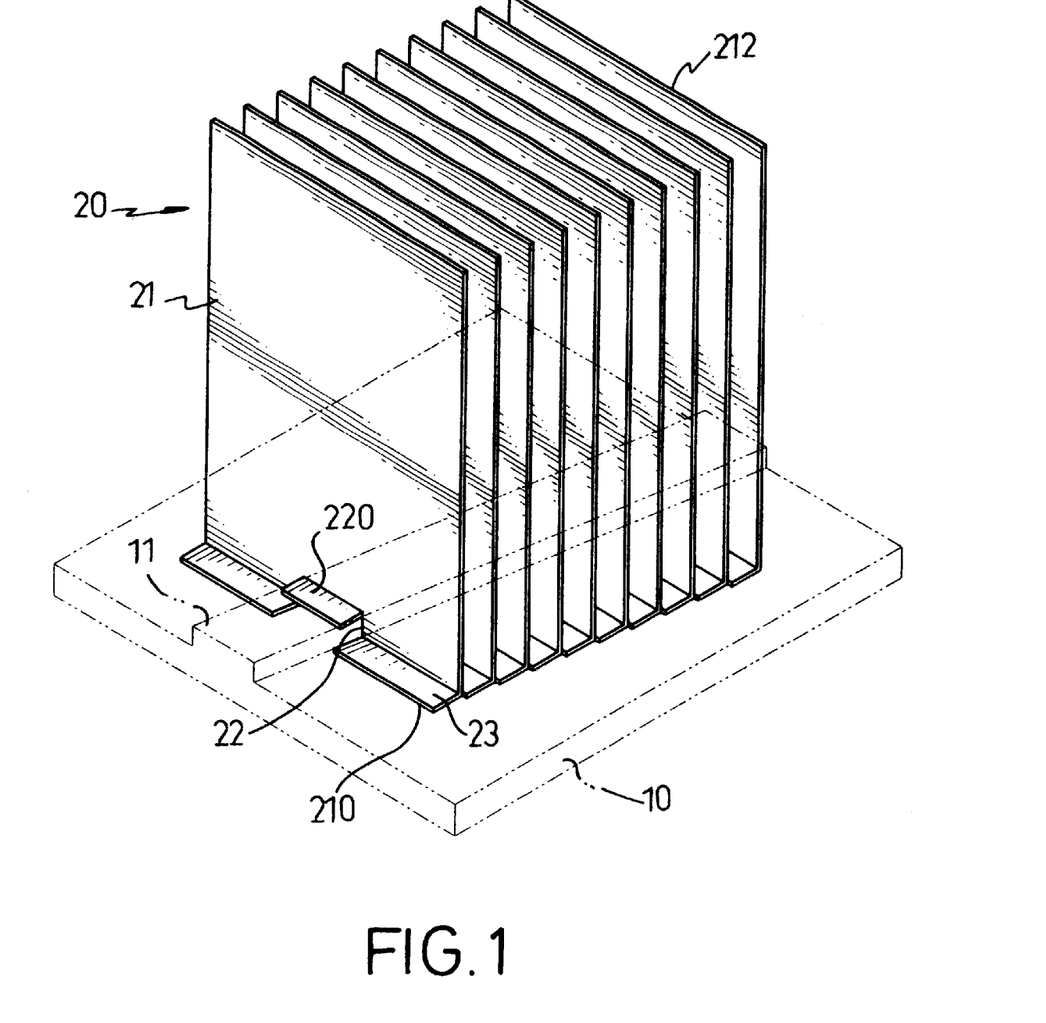
FIG. 1 is a perspective view of the present invention, wherein the base is shown in dashed lines so as to clearly show the structure of the fins when mounted on top of the base.
Figure 2:
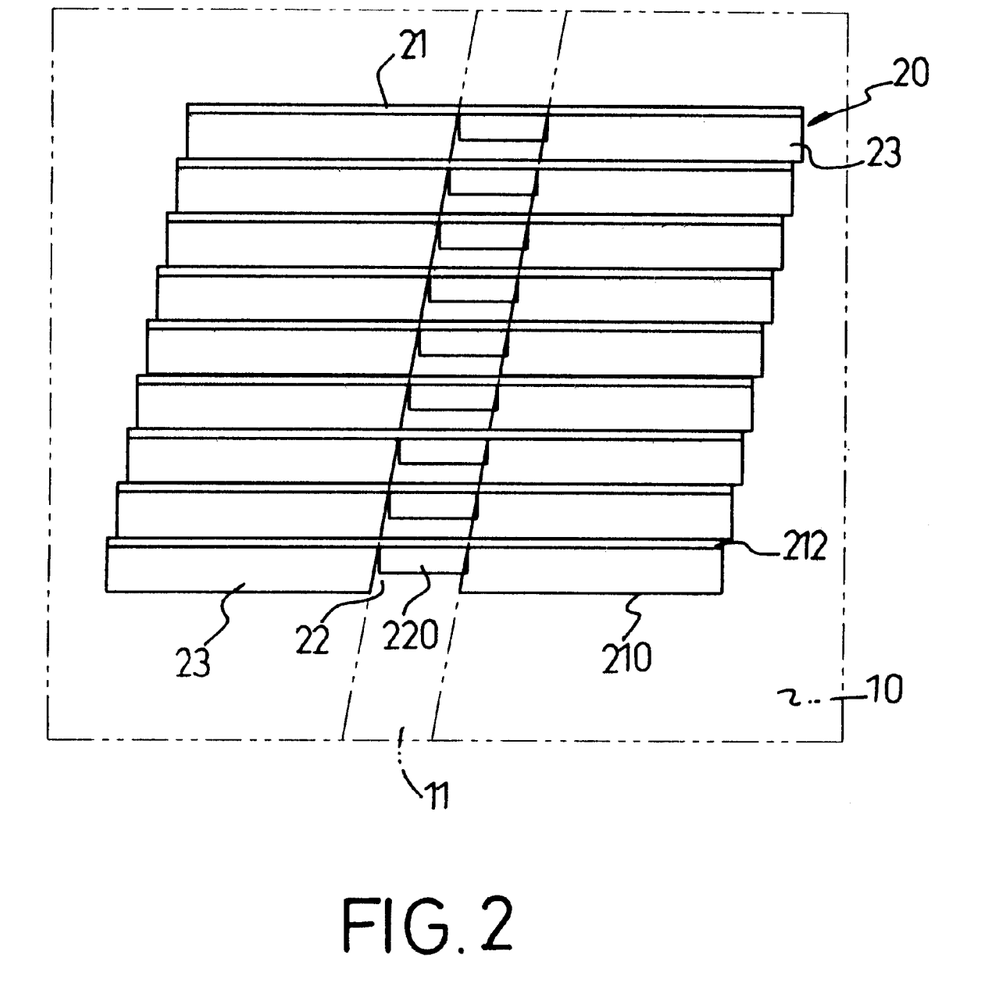
FIG. 2 is a top view of the present invention shown in FIG. 1.

With reference to FIGS. 1 and 2, the heat sink assembly in accordance with the present invention has a base and multiple fins (20) securely mounted on top of the base (10). The base (10) has a ridge (11) formed on top of the base (10).

Each of the fins (20) has a plate (21) with a bottom edge (210) and a top edge (212). A cutout (22) is defined in a mediate portion of the bottom edge (210) to correspond to the ridge (11) of the base (10). Two first bends (23) extend in a same direction from the bottom edge (210) and a second bend (220) extends in the same direction as that of the first bends (23) from a top edge defining the cutout (22).

Figure 3:
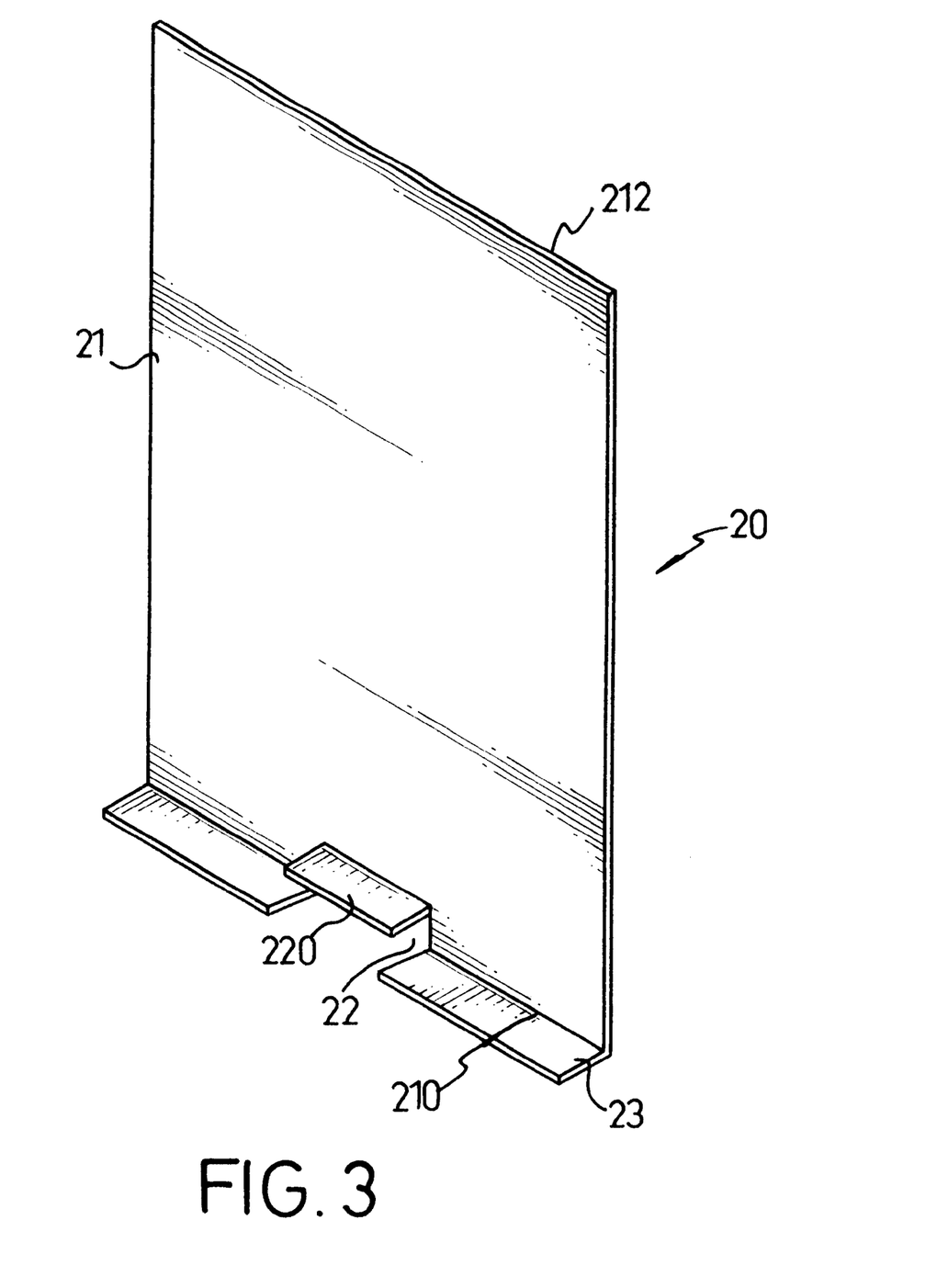
FIG. 3 is a perspective view of the fin.

With reference to FIG. 3 and still taking FIG. 2 for reference, when the fins (20) are mounted on top of the base (10), the first bends (23) are securely engaged with the top face of the base (10) adjacent to the ridge (11) and the second bend (220) is securely engaged with the top face of the ridge (11).

Figure 4:
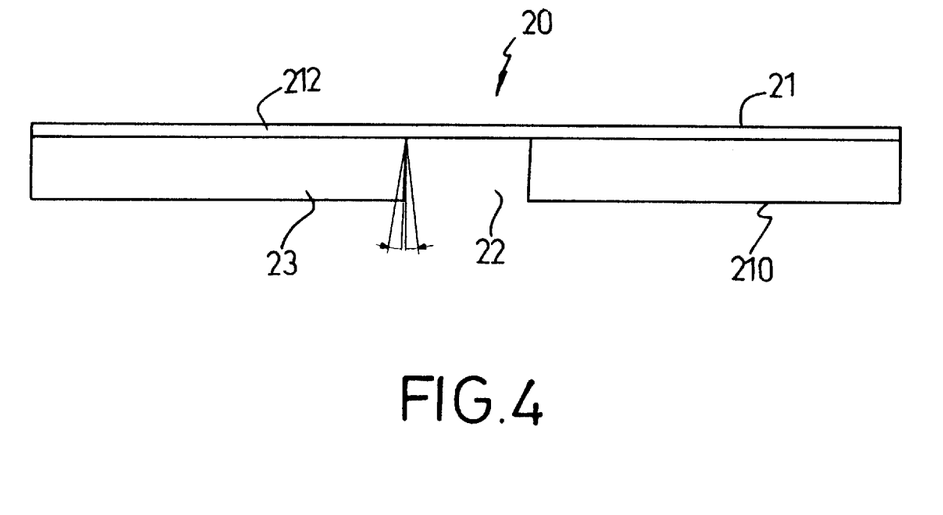
FIG. 4 is a bottom plan view of the fin showing the cutout being so configured to mate the ridge of the base.

With reference to FIG. 4, it is noted that the cutout (22) has a side so configured that after the ridge (11) is received in the cutout (22), the side mates the ridge (11).

Referring to FIGS. 1 and 2, it is also noted that the ridge (11) is inclined with respect to sides of the top face of the base (10) so that the inclined ridge (11) corresponds to the side of the cutout (22) with the side inclined. Therefore, when the fins (20) are mounted on top of the base (10), the first bends (23) and the second bend (220) are able to respectively correspond to and securely engage with the top face of the base (10) and the top face of the ridge (11).

Figure 5:
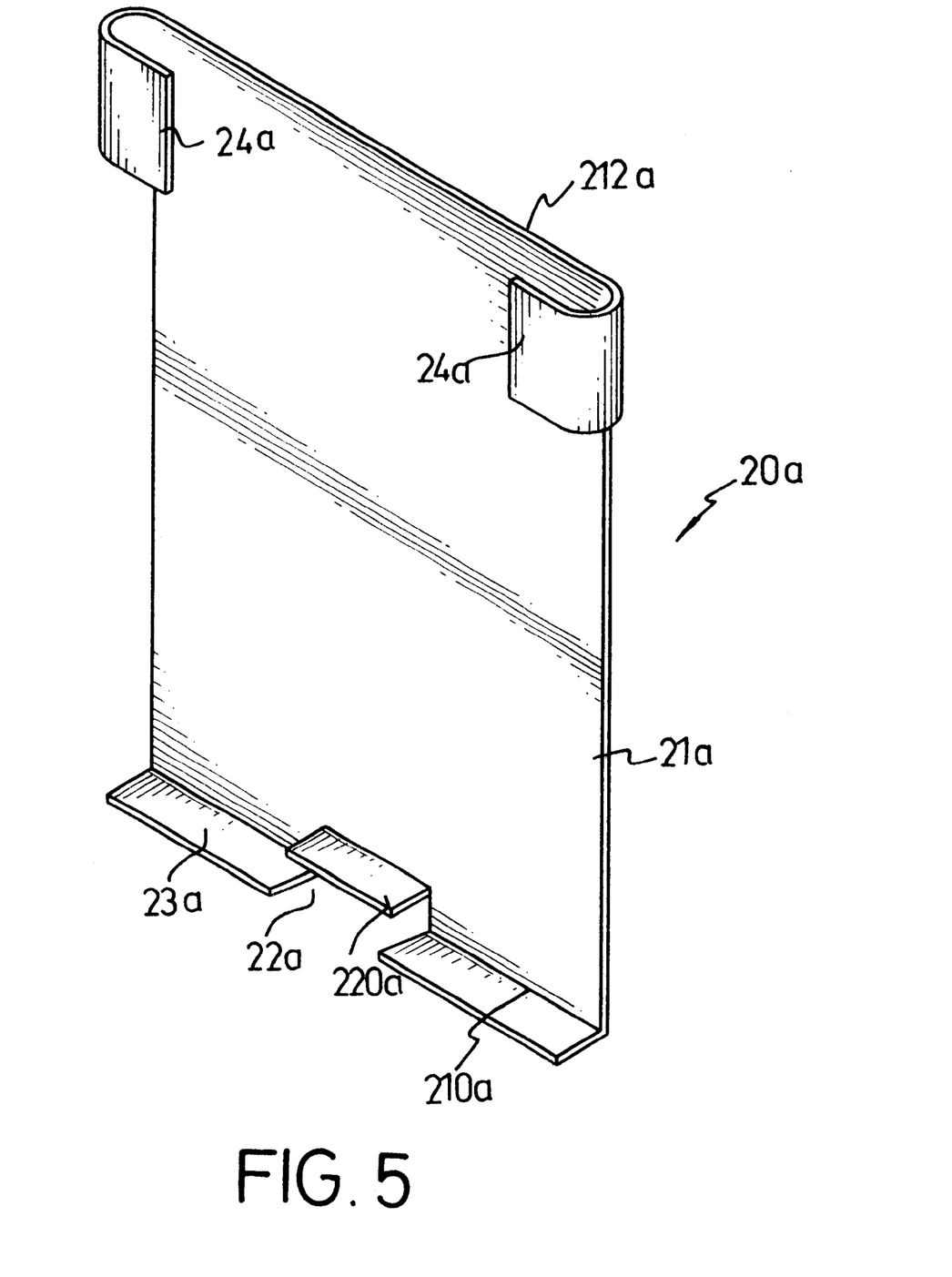
FIG. 5 is a perspective view of the fin of the second preferred embodiment.
Figure 6:
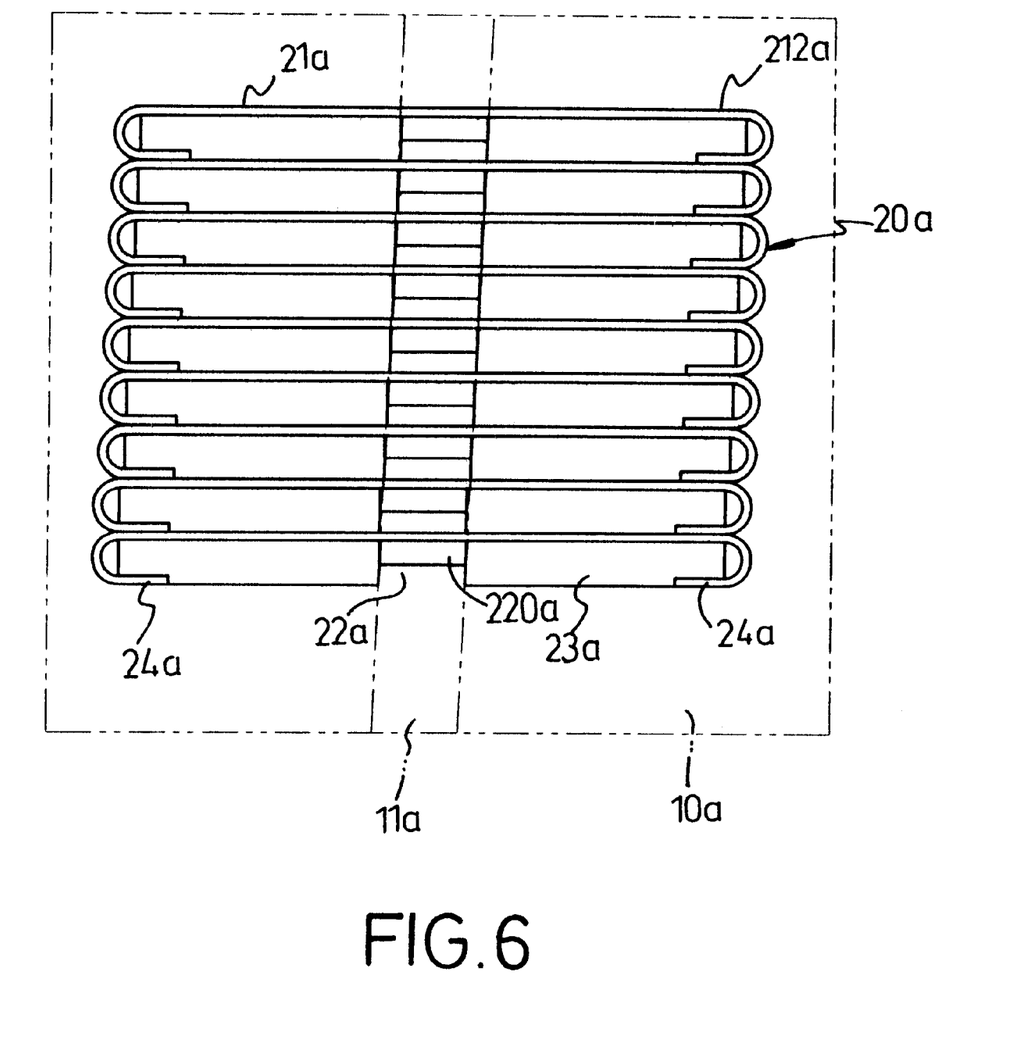
FIG. 6 is a top plan view of the fins assembled on top of the base.

With reference to FIG. 5, another embodiment of the present invention is shown, wherein each of the fins (20a) has a plate (21a) with a bottom edge (210a) and a top edge (212a). A cutout (22a) is defined in a mediate portion of the bottom edge (210a). Two first bends (23a) extend in a same direction from the bottom edge (210a) and a second bend (220a) extends in the same direction as that of the first bends (23a) from a top edge defining the cutout (22a). Further, two arms (24a) respectively extend from opposite sides of the plate (21a) toward each other. With the two arms (24a), after the fins (20a) are mounted on top of the base (10a), the fins (20a) are able to engage with each other via the arms (24a), as shown in FIG. 6.

Figure 7:
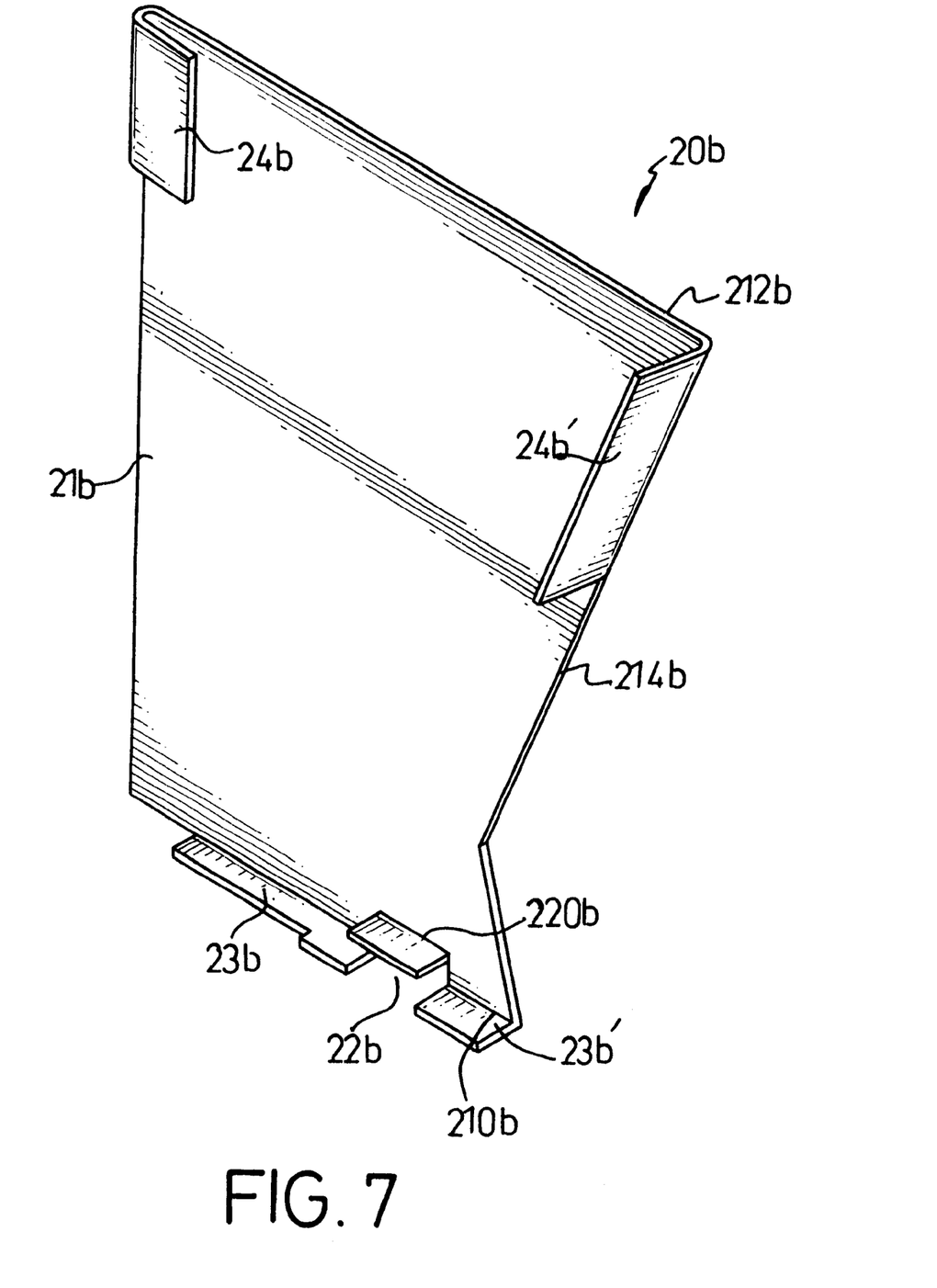
FIG. 7 is a perspective view of the fin of the third embodiment.

With reference to FIG. 7, still another preferred embodiment of the present invention is shown, wherein each of the fins (20b) has a plate (21b) with a bottom edge (210b) and a top edge (212b). A cutout (22b) is defined in a mediate portion of the bottom edge (210b). Two first bends (23b) extend in a same direction from the bottom edge (210b) and a second bend (220b) extends in the same direction as that of the first bends (23b) from a top edge defining the cutout (22b). A first arm (24b) extends from one side of the plate (21b) and in parallel with the plate (21b). A second arm (24b') extends perpendicular with respect to the plate (21b). The first arm (24b) extends toward the second arm (24b'). An indented side (214b) is formed on one side of the plate (21b).

Figure 8:
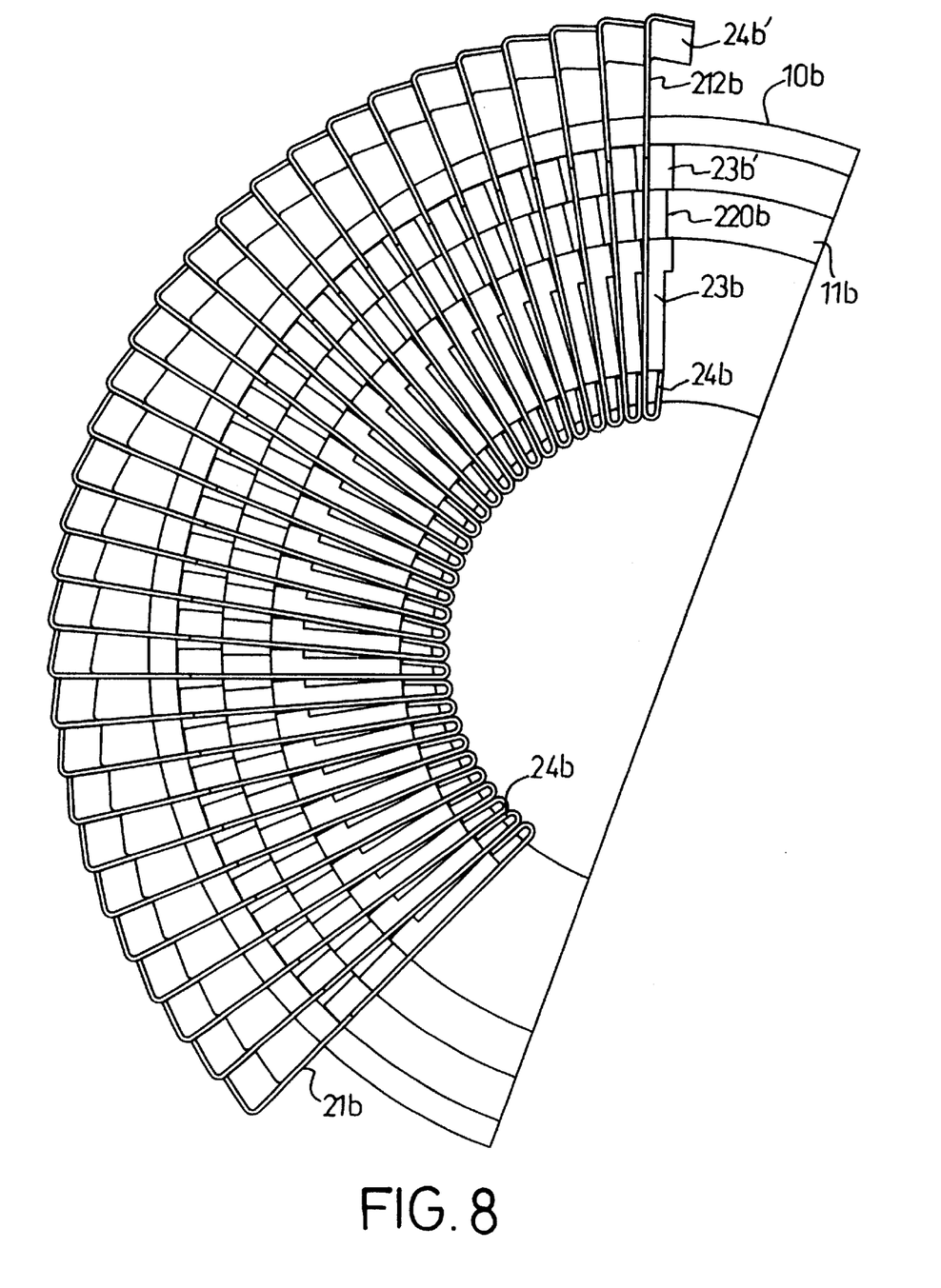
FIG. 8 is a top plan view of the application of the third embodiment of the fins mounted on top of the second embodiment of the base.
Figure 9:
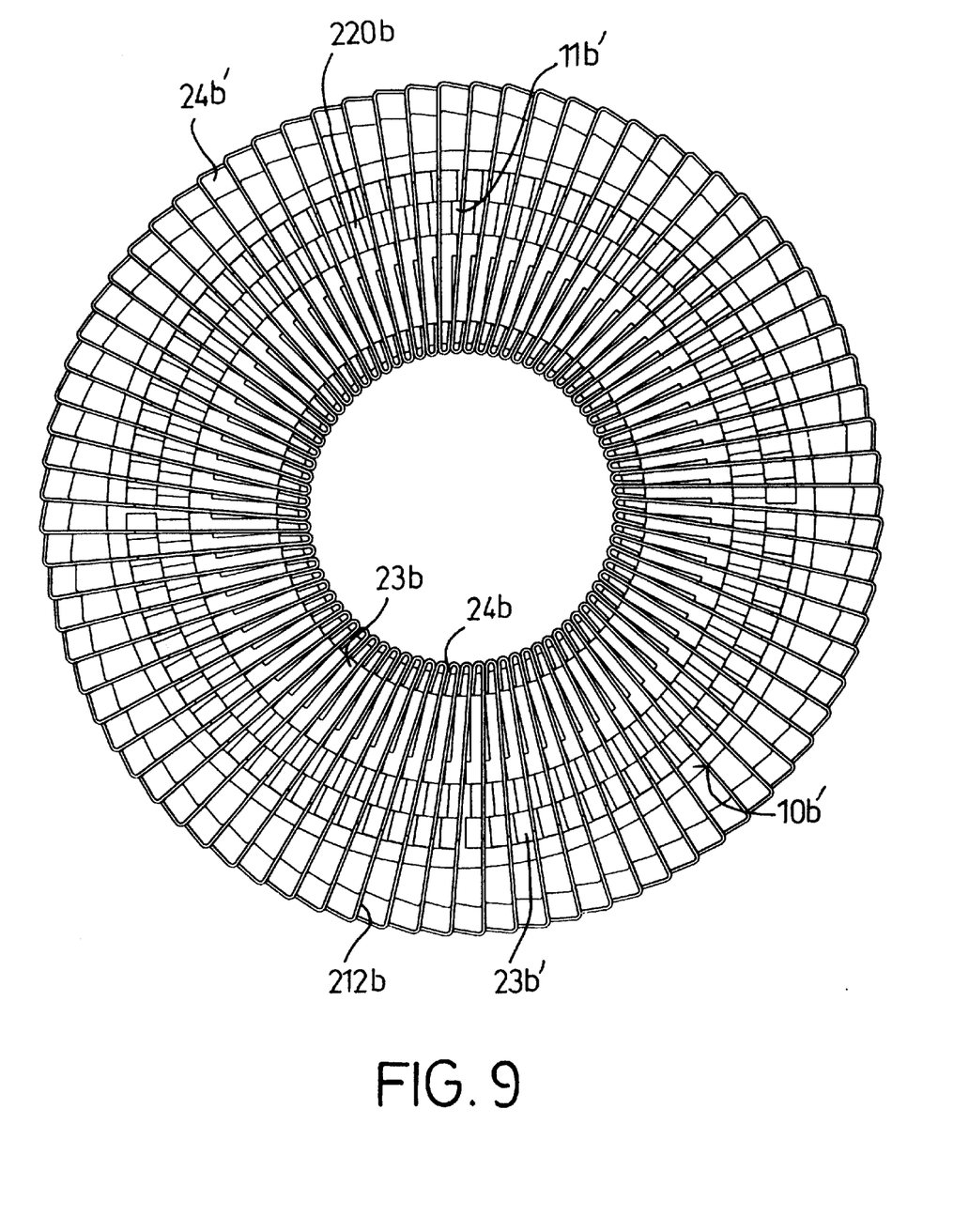
FIG. 9 is a top plan view of the application of the third embodiment of the fins mounted on top of the third embodiment of the base.

With reference to FIG. 8, it is noted that the fins (20b) in FIG. 7 are applied to a base (10b) with a ridge (11b) annularly formed on the base (10b). FIG. 9 shows that the fins (20b) are applied to a base (10b') with a ridge (11b') circularly formed on the base (10b').

From the foregoing description, it is noted that after the fins (20,20a,20b) are mounted on top of the various bases (10,10a,10b,10b'), the user is able to have different options to use different combinations to cope with different mounting situations. Furthermore, due to the various options, the user may also choose the combination to adapt to the air flow direction of the heat dissipation fan so as to have the premium heat dissipation effect.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation assembly comprising:
   a base with a ridge;
   multiple fins mounted on top of the base and each of the fins having a plate with a cutout defined in a mediate portion of a bottom edge to correspond to the ridge of the base, two first bends respectively extending from opposite sides of the cutout in a same direction from the bottom edge,
   whereby the fins are able to be securely mounted on top of the base via the two first bends.

2. The heat dissipation assembly as claimed in claim 1, wherein a second bend extends in a direction the same as that of the first bends from a top edge defining the cutout.

3. The heat dissipation assembly as claimed in claim 2 further comprising two arms extending from a top portion of the plate toward each other.

4. The heat dissipation assembly as claimed in claim 3, wherein the plate further has an indented side.

5. The heat dissipation assembly as claimed in claim 2 further comprising a first arm extending from a side of the plate and a second arm extending from a side opposite to the side of the first arm, wherein the first arm extends toward the second arm.

6. The heat dissipation assembly as claimed in claim 5, wherein the plate further has an indented side.

7. The heat dissipation assembly as claimed in claim 1, wherein the ridge is inclined with respect to the base.

8. The heat dissipation assembly as claimed in claim 7, wherein the cutout has a side so configured to mate the ridge.

9. The heat dissipation assembly as claimed in claim 1, wherein the ridge is annularly formed on the base, and
   a first arm extends from a side of the plate and a second arm extends from a side opposite to the side of the first arm, wherein the first arm extends toward the second arm, wherein the second arm is so configured that after the multiple fins are mounted on top of the base, the second arm of each fin engages with an adjacent fin to form an arcuate shape.

10. The heat dissipation assembly as claimed in claim 9, wherein the cutout has a side so configured to mate the ridge.

11. The heat dissipation assembly as claimed in claim 1, wherein the ridge is circularly formed on the base.

12. The heat dissipation assembly as claimed in claim 11 further comprising a first arm extending from a side of the plate and a second arm extending from a side opposite to the side of the first arm, wherein the first arm extends toward the second arm and the second arm is so configured that after the multiple fins are mounted on top of the base, the second arm of each fin engages with an adjacent fin to form a circular shape.

13. The heat dissipation assembly as claimed in claim 12, wherein the cutout has a side so configured to mate the ridge.

* * * * *